(12) United States Patent
Roberts et al.

(10) Patent No.: US 7,183,785 B2
(45) Date of Patent: Feb. 27, 2007

(54) TEST SYSTEM AND METHOD FOR REDUCED INDEX TIME

(76) Inventors: Howard Roberts, 4519 Ave. D., Austin, TX (US) 78751; Craig Spradling, 5615 Shoalwood Ave., Austin, TX (US) 78756

( * ) Notice: Subject to any disclaimer, the term of this patent is extended or adjusted under 35 U.S.C. 154(b) by 177 days.

(21) Appl. No.: 10/767,932

(22) Filed: Jan. 29, 2004

(65) Prior Publication Data

US 2005/0168233 A1 Aug. 4, 2005

(51) Int. Cl.
*G01R 31/02* (2006.01)
*G01R 31/28* (2006.01)

(52) U.S. Cl. ............... 324/763; 324/755; 324/756
(58) Field of Classification Search ............ 324/763
See application file for complete search history.

(56) References Cited

U.S. PATENT DOCUMENTS

| | | | | |
|---|---|---|---|---|
| 5,650,732 A | * | 7/1997 | Sakai ................ | 324/755 |
| 6,225,798 B1 | * | 5/2001 | Onishi et al. ........ | 324/158.1 |
| 6,515,470 B2 | * | 2/2003 | Suzuki et al. ........ | 324/158.1 |
| 6,831,454 B2 | * | 12/2004 | Bae et al. ........... | 324/158.1 |
| 6,958,617 B1 | | 10/2005 | Rhodes | |
| 2004/0143411 A1 | * | 7/2004 | Wu ................... | 702/117 |

OTHER PUBLICATIONS

PCT Notification of Transmittal of the International Search Report and the Written Opinion of the International Searching Authority, dated Jan. 20, 2006.

* cited by examiner

*Primary Examiner*—Ha Tran Nguyen
*Assistant Examiner*—Emily Y Chan
(74) *Attorney, Agent, or Firm*—The Law Firm of H. Dale Langley, Jr., PC

(57) ABSTRACT

A system for testing with an automated test equipment (ATE). The ATE includes a tester, an interface board connected to the tester, a first socket and a second socket of the interface board, a first manipulator arm connected to the tester, and a second manipulator arm connected to the tester. The first socket and the second socket are parallel-wired to the tester. The ATE also includes a switch connected to the tester and the interface board. The switch selectively effects communicative connection of the tester to either of the first socket or the second socket at each instant. During testing via one of the sockets, one of the manipulator arms moves post-test devices and replaces next devices for testing in the other of the sockets. After testing via one of the sockets is completed, the switch immediately connects the other socket and testing of next devices commences and continues for those devices. The system continuously repeats the movement and replacing of devices in each respective socket during testing of devices at the other socket. Index time for testing with the system is substantially negligible.

3 Claims, 11 Drawing Sheets

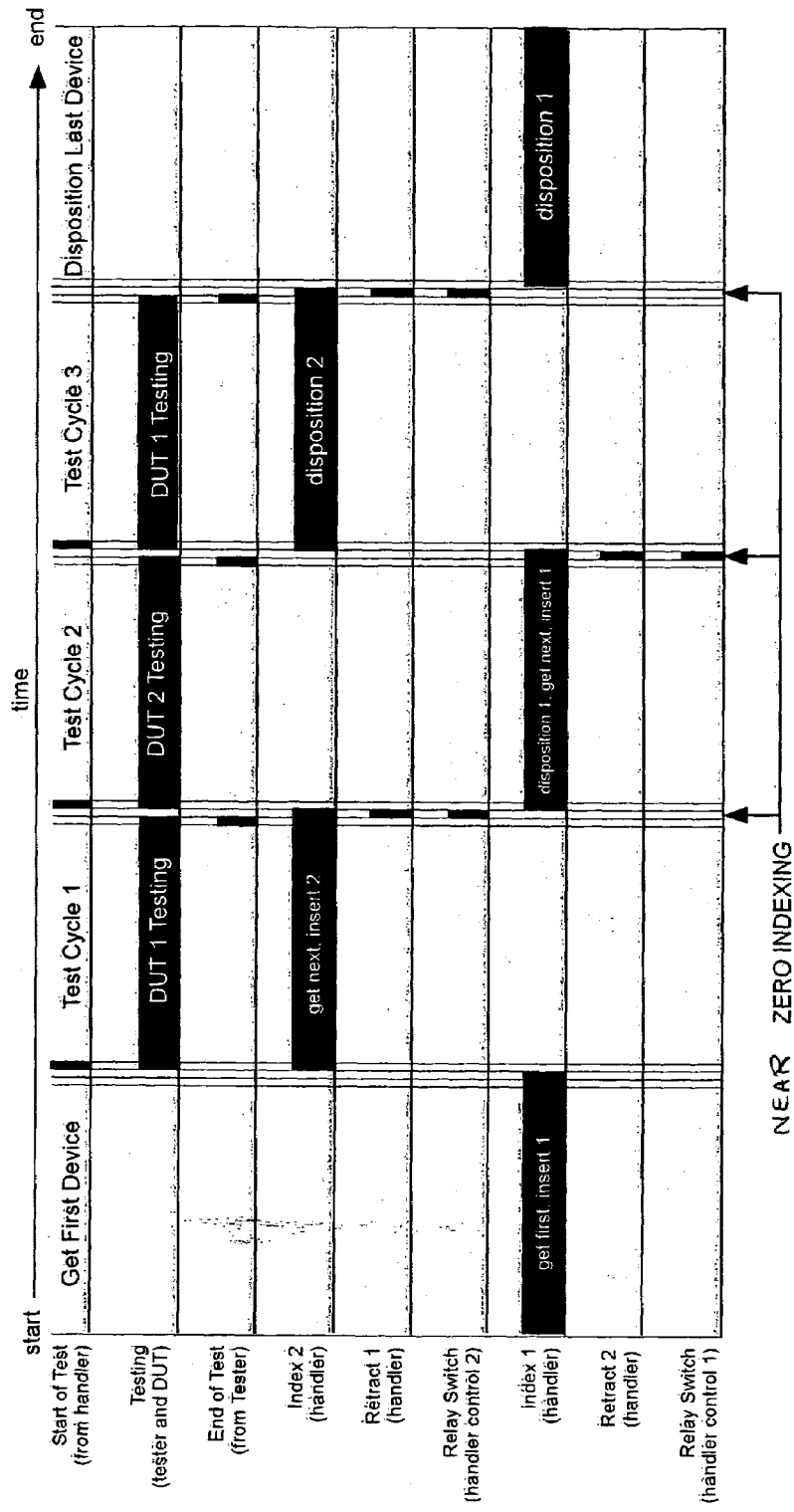

TEST SYSTEM AND METHOD FOR REDUCED INDEX TIME

BACKGROUND OF THE INVENTION

The present invention generally relates to automated manufacture systems and methods and, more particularly, relates to automated and robotic semiconductor equipment systems and methods, particularly for testing and quality control, and improvements thereto, including reduction of index timing delays and the like.

Automated manufacturing equipment has streamlined the manufacturing process in many industries. Moreover, such automation has increased reliability and results. A downside of automation has been timing delays in equipment operations. Particularly, where expensive manufacturing equipment is involved, delays in operations of the equipment, such as during mechanical movements in transferring devices under test, limit returns on the costs of such equipment because of idle or non-testing use periods during mechanical manipulations, resets, and the like. An impetus in manufacturing technology and operations has, therefore, been to limit times in which costly test equipment is idle and not performing the applicable test function, for example, when robotically substituting next test pieces.

In semiconductor manufacture, semiconductor device test equipment is a costly capital requirement. Conventionally, such test equipment has included a robotic manipulator for handling the devices being tested. This robotic manipulator system is commonly referred to as a "handler" and is typically configured with one or more robotic arms referred to as "manipulators." The manipulator mechanically picks up a device for testing, inserts the device into an interface test board socket and issues a start-of-test signal to the tester. The tester then conducts a test on the device and returns a test result and an end-of-test signal to the handler which causes the handler to disposition the device to a post-test tray or receptacle for holding tested devices. This process is repeated as long as the handler senses that there are additional devices available for test. This system as a whole is sometimes referred to as a "test cell."

During the time required for the handler to disposition a device(s) just tested and replace it with the next device(s) to be tested, the tester remains substantially idle. This idle time, sometimes referred to as the "index time" for the particular tester and system, involves mechanical manipulations of the devices awaiting test and having been tested. These mechanical manipulations are limited in speed of operations by various factors, including, for example, physical and speed constraints to ensure that devices to be tested are not damaged, contaminated, dropped, and the like.

The time required to test a device is sometimes referred to as "test time" for a particular device, test, tester, and system. When the system is operational in a manufacturing capacity, it is either indexing during the index time or otherwise testing during the test time.

Previously, test equipment manufacturers have focused efforts to reduce index time on design of manipulation equipment to increase speed of mechanical operations. Although speeds of mechanical operations in handling the test devices have increased significantly over time, there nonetheless remains significant mechanical index time required to manipulate test devices between tests, by the robotic handlers. Moreover, with increased speeds of mechanical manipulation equipment operations, costs increase for the equipment, including calibration, replacement frequency, maintenance, parts, and others. Given the constraints and precautions that must be addressed in speeding mechanical manipulations of many types of test devices and handlers, further speeding of mechanical operations is subject to economic and physical barriers.

In any event, reducing index time can provide greater returns on investments in test equipment, particularly where the test equipment is costly. It would, therefore, be a significant improvement in the art and technology to further reduce index time involved in test operations in manufacturing environments. Particularly in semiconductor manufacture, economic and other gains and advantages are possible if index times are reduced in the testing of semiconductor devices. It would also be an improvement to provide new and improved systems and methods for achieving reduced index times, without requiring substantial changes or new developments in existing mechanical operations of device handlers and similar robotic or automated components for the testing.

For purposes of background understanding, conventional testing systems and operations are now described:

Referring to FIG. 1, a conventional system 100 for testing a device 102 includes a tester 104, an interface board 106 connected to the tester 104 that makes available the tester 104 resources (e.g., testing protocols, signals, and procedures run by the tester) to the device 102 under test, and a robotic handler 108. It is to be understood that the device 102 can be a single device or multiple devices simultaneously connected to the tester and tester resources for concurrent testing operations, but that the singular term "device" is used herein to refer to devices that are so simultaneously connected and concurrently tested. The robotic handler 108 is communicatively connected to the tester 104. The interface board 106 is communicatively connected to the tester 104. The interface board 106 includes one test socket 110 for receiving and maintaining the device 102 during testing.

The test socket 110 provides a physical mechanism that assists the manipulator arm 109 in the alignment of the device 102 under test, so that electrical contact between the device 102 under test and the tester 104 is adequately maintained while the device 102 is undergoing electrical test. Typically the precision of the manipulator arm 109 is too course to provide and maintain proper electrical contact between the device 102 under test and the tester 104 and relevant tester resources, and it is the test socket 110 which provides the mechanics of fine alignment required to maintain proper electrical contact during test.

Furthermore, a single interface board can have more than one test socket. When multiple sockets are present on the interface board, each socket has been typically connected to respective distinct sets of tester resources from a single tester 104. In effect, the tester 104 can perform different tests on each socket, but not the same tests on each socket concurrently. There can be certain exceptions, in special cases, where the tester resources can drive signals from the tester to multiple devices at the same time. Such resources include power supplies, digital drivers, and analog waveform generators. In each case the resource is considered an output resource from the particular tester, and the tester in such use must be specially configured and have functionality required to perform the separate distinct testing in concurrent manner. Most conventional testers do not have such special configuration or functionality and, in any event, any such special testers can be significantly more expensive and/or limited in application when compared to most conventional testers.

The robotic handler 108 mechanically moves and operates to pick up and handle the device 102, from among one or more devices to be tested. Once the device 102 to be tested is picked-up by the manipulator arm 109, the handler 108 controls the transfer of the device 102 into position in the appropriate socket 110 of the interface board 106. The tester 104 then commences to test the device 102. After the test is completed by the tester 104, the handler 108 mechanically removes the device 102 from the socket 110 and transfers the device 102 to a location of tested devices.

In operations of the conventional system 100, a set of devices to be tested are staged at the input to the handler 108 by a human operator. The operator then instructs the handler 108 to begin retrieving devices to be tested and to stage the next available device by inserting it into the test socket 110. Once the handler 108 has sensed that the first device 102 is in place in the test socket 110 and ready for test, the handler 108 issues a start-of-test signal to the tester 104. In response to the start-of-test signal, the tester 104 executes a test program that electrically stimulates, via the test socket 110, the device 102 under test and measures the output response from the device 102. The tester 104 compares the output response to a set of expected response data and judges the results as either a "pass" or a "fail" of the device 102.

If the interface board contains multiple test sockets and the tester is capable of concurrent testing with different tester resources of the tester, as with the certain specialized tester previously mentioned, the tester must query the handler status to determine which test sockets have devices ready for test and which do not. The tester can then ignore failing test results from empty test sockets and test only active test socket sites with devices inserted. Of course, as previously mentioned, such special testers with these capabilities are relatively uncommon, expensive, and limited in application.

Once the test program has concluded testing for the device 102 and a pass/fail determination of the test results has been made by the tester 104, the tester 104 communicates back to the handler 108 the test result data for the device 102 just tested and follows by an end-of-test signal to the handler 108. The handler 108 receives the end-of-test signal from the tester 104, and the handler 108 uses the test results data to disposition the device 102 just tested into an output staging area for tested devices, such as separate holding areas for passing devices and for failing devices, respectively.

If the interface board contains multiple test sockets and the tester is capable of concurrent testing with different tester resources of the tester, as with the certain specialized tester previously mentioned, the tester must communicate results data for each of the active test socket locations that is site specific and the handler must disposition each of the devices accordingly. Again, any such arrangement requires specialized tester and possibly special handler equipment, and these each have the problems of expense and limited applications.

In ongoing operations of the system 100, once the handler 108 has dispositioned the device 102 just tested, the process repeats in succession until there are no additional untested devices remaining to be tested, or until any error condition in the handler status or tester halts operation, or until a human operator intervenes to halt the testing.

In each case of a test in this conventional system 100, the handler 108 individually obtains and transfers the respective device 102 then being tested. During the mechanical operations of the handler 108 in picking up, setting in the socket 110, and locating after test, the tester 104 remains idle without conducting any test. The index time for the system 100 is substantially the time required for the mechanical operations of the handler 108 when removing and dispositioning the tested device and then retrieving and inserting each next successive untested device for testing. The index time also includes any time interval between the end-of-test signal from the tester 104 to the handler 108 and the next start-of-test signal from the handler 108 to the tester 104.

Referring to FIG. 4, a conventional process 400 for testing a device includes a step 402 of initiating a first manipulator. In the step 402, for example, a signal is communicated to a robotic handler having the first manipulator. The signal is communicated by a tester or other source, to indicate to the handler that the first manipulator should initiate actions to obtain and locate a device for testing. The device is, for example, a semiconductor device or any other manufactured part or element that is to be tested by the particular tester.

In a step 404, the first manipulator mechanically moves its arm to retrieve a first device for testing. The first manipulator grips or otherwise retains the first device. Then, in a step 406, the first manipulator mechanically picks-up and manipulates the first device, for example, appropriately orienting the first device for testing. In a step 408, the first manipulator mechanically moves the first device to an interface board connected to the tester and inserts the first device in a socket or other test cell of the interface board.

Once the first device is located in the socket or other test cell, the tester commences a step 412 of testing of the device. Testing can include power test, logic test, and any of a wide variety of other quality control or device conformance tests. The testing may take some period of time for completion, depending on the test being performed. During the testing, the first manipulator maintains the first device in position at the interface board for the test.

When the testing step 412 is completed, the tester signals to the handler and the first manipulator is activated to mechanically remove the device, in a step 414, from the socket or other test cell. The first manipulator then moves the first device to a desired post-test location in a step 416. In a step 418, the first device is released by the first manipulator at the post-test location.

The process 400 then returns to the step 402, in order to repeat the steps with respect to a next test device and a next test of the device. As previously mentioned, the time during the process 400 required for the operations of the first manipulator of the handler to pick-up, move, place, remove and dispense of each device, is referred to as the "index time" for the test system. During the index time of operations of the first manipulator, the tester remains in an idle state in which no test is being conducted. The index time that is required in such process 400 delays and limits the entire process 400.

From the foregoing description of the conventional system and method for testing devices, it can be readily appreciated and understood that reductions of index time required in the conventional system and method would provide significant advantages. Moreover, it can be appreciated and understood that any reductions that require specialized tester and handler equipment can be inordinately expensive and limited in application.

The present invention provides these and other advantages and improvements, including improvements and nuances in the foregoing respects, without problems and disadvantages previously incurred in practice.

SUMMARY OF THE INVENTION

An embodiment of the invention is a system for testing. The system includes a tester, an interface board that interconnects the tester resources to the device(s) under test, one or more pairs of test sockets wired in parallel to the same set of tester resources, a first manipulator arm connected to and controlled by a handler, a second manipulator arm connected to and controlled by a handler, and one or more switches controlled by the handler or tester and connected between each pair of test sockets. Each switch selectively effects communicative connection of the tester to either test socket of an associated pair of test sockets mounted on the interface board.

In another embodiment each switch is in response to the location of the next device to be tested, which is in turn determined by the operation of the manipulator arms of the handler. Each manipulator arm operates to locate a device for testing in an available (empty) test socket prior to an end-of-test signal being received for a device under test in the other test socket of an associated pair of test sockets.

In a further embodiment, a controller is connected to the first manipulator arm, the second manipulator arm, the switches, and also to the tester. This controller controls the manipulator arms in an autonomous and coordinated fashion. Coordination is for switch control and communication with the tester. Autonomous operation provides for continued operation in the event that one of the manipulator arms fails.

Another embodiment of the invention is a method of testing. The method includes testing devices in one of the test sockets immediately upon completion of the step of testing devices in the other test socket of an associated pair of test sockets, and vice versa.

In another embodiment, the method includes replacing devices for testing at one of the test sockets during the step of testing devices in the other test socket and vice versa.

Yet a further embodiment includes switching the testing between the first test socket and the second test socket.

BRIEF DESCRIPTION OF THE DRAWINGS

The present invention is illustrated by way of example and not limitation in the accompanying figures, in which like references indicate similar elements, and in which:

FIG. 12 illustrates timing relationships in test cycles of the method of FIG. 5 and the systems of FIGS. 6, 8, 9, 10 and 11, wherein negligible index time is required, according to certain embodiments of the invention.

DETAILED DESCRIPTION

Figure 2:
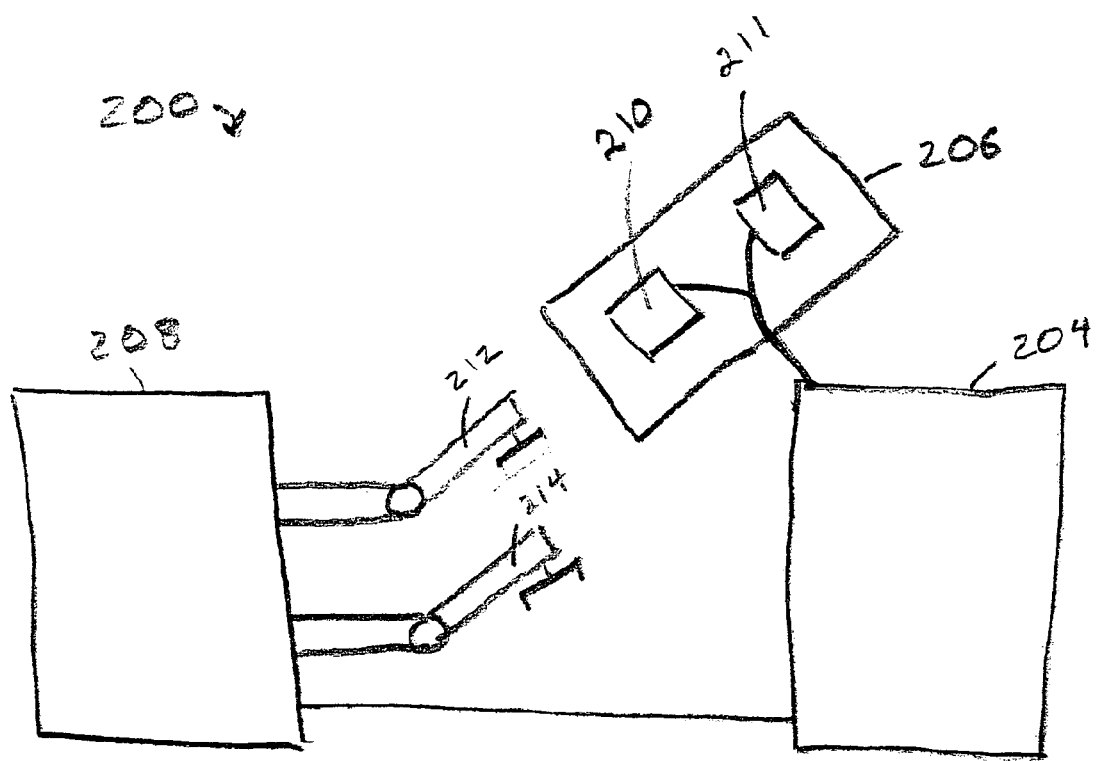
FIG. 2 illustrates a system for testing including a tester, an interface board that interconnects the tester and its test resources to the test device(s) under test, two test sockets connected in parallel to the same set of tester resources and mounted to the interface board, and an automated handler with dual manipulator arms, according to certain embodiments of the invention.

Referring to FIG. 2, a system 200 for testing a device includes a tester 204, an interface board 206 communicatively connected to the tester 204 for interconnecting the tester resources to the device under test, and a robotic handler 208. The robotic handler 208 is communicatively connected to the tester. 204. The interface board 206 is communicatively connected to the tester and two or more test sockets 210 and 212. The test sockets 210 and 221 are wired in parallel, via the interface board 206 connection with the tester 204, to the tester 204 and to the tester resources of the tester 204. Because of the parallel connectivity of the test sockets 210 and 212, each socket 210, 212 is separately interfaced to the tester 204 and to the same test resources of the tester 204; however, the tester 204 can test only one or the other of the sockets 210, 212 via the same tester resources, at any instant.

Figure 1:
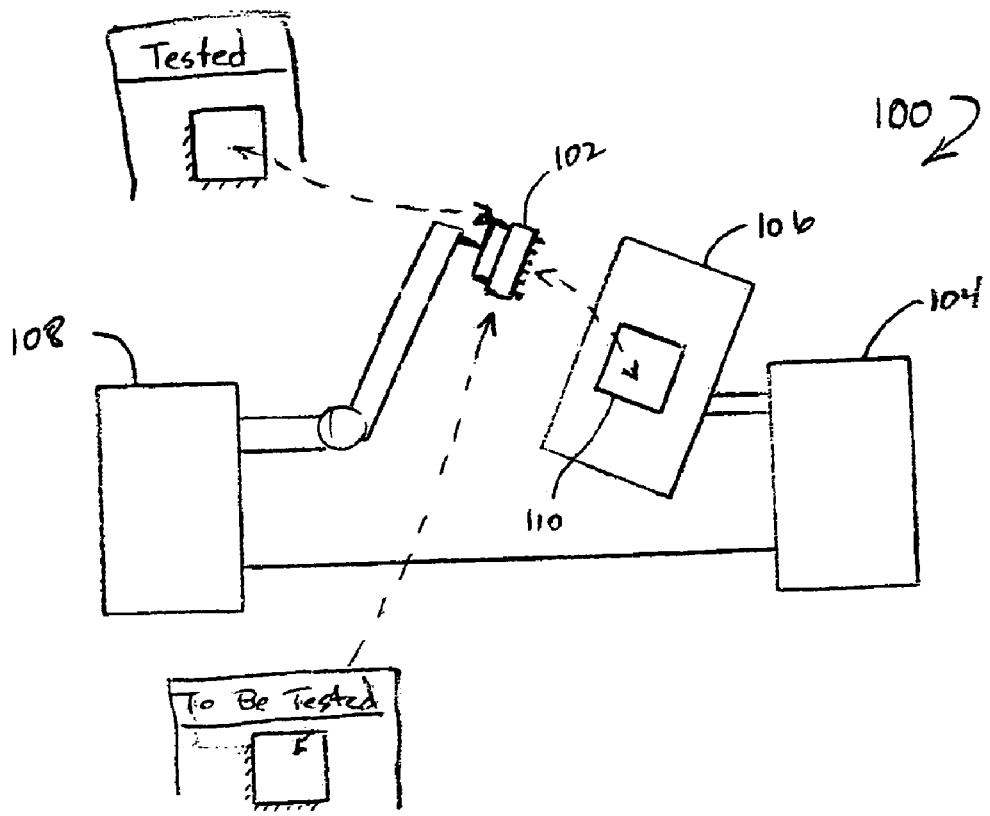
FIG. 1 illustrates a prior system for testing including a tester, an interface board that interconnects the tester resources to the device under test, one test socket on the interface board, and an automated handler with a single manipulator arm.

In the system 200, the handler 208 and the tester 204 communicate substantially as described in reference to FIG. 1 and system 100 with regards to the handler 108 and the tester 104, in that the handler 208 issues a start-of-test signal to commence testing by the tester 204 and then the tester 204 returns to the handler 208 various result data and an end-of-test signal on test completion so that the handler 208 then commences next test device mechanical placement operations. Even in a multi-site configuration (where multiple sockets are wired to different distinct test resources of a tester that permits concurrent testing via separate test resources), the same information required to identify missing devices in such a multi-site configuration are similarly communicated to the tester 204 by the handler 208. Because these communications are substantially conventional (whether the tester does or does not provide for concurrent testing via different test resources), the tester 204 in the system 200 can be any conventional tester having sequential testing capabilities for respective devices or sets of devices, such that next testing of the same tester resources can promptly commence via the tester upon completion of a preceding test of those tester resources.

The robotic handler 208 includes a first manipulator 212 and a second manipulator 214, each connected to and controlled in a coordinated and autonomous fashion by the robotic handler 208. Each of the first manipulator 212 and the second manipulator 214 is capable of handling a separate test device (or devices, if the manipulators 212, 214 have capabilities of handling more than one test device in each mechanical manipulation). When the first manipulator 212 has picked-up and positioned a first device to be tested in the socket 210 of the interface board 206, the other second manipulator 214 is concurrently retrieving a next second device to be tested. During testing of the first device in the socket 210, the second manipulator picks-up and stages the second device to be tested at socket 211.

The term "staging", used above, means that the second device handled by the manipulator 214 is not inserted into the socket 211, but is positioned mechanically close to insertion at the socket 211 without making electrical contact with the socket 211. Then, when the handler 208 receives an end-of-test signal from the tester 204, the manipulator arm 212 removes the first device from socket 210, while manipulator arm 214 simultaneously inserts the second device into the socket 211. As soon as manipulator arm 214 has fully inserted the second device into socket 211 and full electrical contact has been made between the second device and the socket 211, the handler 208 issues a next start-of-test signal to the tester 204 and testing begins on the device inserted into socket 211.

From the perspective of what is communicated to, controlled by, and tested at the tester 204, there is no difference between socket 210 and socket 211 since they are both connected to the tester 204 and its same set of tester resources. However, the tester 204 conducts testing via any particular tester resources only as to one of the sockets 210, 211 at each instant. Negligible index time results at the tester 204 in any lag period between each end-of-test signal that the tester 204 issues to the handler 208 and each next start-of-test signal issued by the handler 204 to the tester 208. Because of the parallel interfacing of the sockets 210, 211 via the interface board 206 to the tester 208, only one of the sockets 210, 211 wired to each same set of tester resources has a device inserted at any instant of time.

Hereinafter, the operation of staging of each next device to be tested close to insertion in a socket, but without making electrical connection to the socket, is referred to as "pre-positioning"; and the phrase "manipulator locating a device" includes either full insertion for electrical contact or pre-positioning of a device relative to a socket.

In the system 200, when testing begins on the second device in socket 211, the first manipulator 212, as a requirement for the system 200 (and as is the arrangement with operations of any conventional tester), has already removed the first device from the socket 210, and proceeds without delay to disposition the first device just tested and then retrieve and pre-position a next untested device for testing. The mechanical motions of the manipulator 212 in retracting the already tested first device, to the pre-positioning of the next untested device, occur during the time period that the second device in the socket 211 is being tested. These mechanical motions of the manipulator (either manipulator 212 or manipulator 214) during the time period that the other manipulator (manipulator 214 or 212, respectively) maintains a next device in a socket for active testing, is herein referred to as "manipulator indexing." Manipulator indexing on manipulator 212 occurs while manipulator 214 is engaged in testing the second device in the socket 211 and also while manipulator 214 is not mechanically indexing. Likewise, manipulator indexing on manipulator 214 occurs while manipulator 212 is engaged in testing the device in the socket 210 and also while manipulator 212 is not mechanically indexing. The respective manipulator mechanical operations, and relevant manipulator indexing, is repeated for so long as either there remains additional untested devices available and waiting for test, there are no error conditions that halt operation of the system 200, or a human operator has not intervened to interrupt the sequence.

Figure 3:
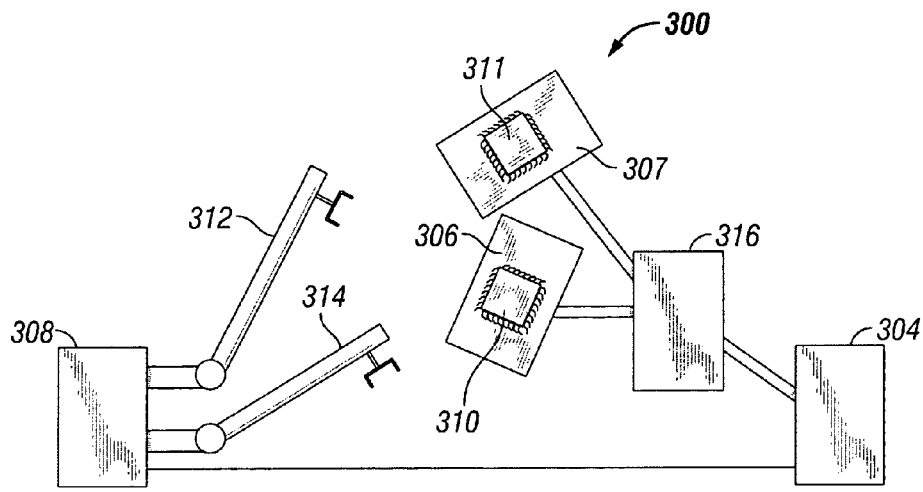
FIG. 3 illustrates a system for testing substantially like that of FIG. 2, also including a switch on the interface board that interconnects the tester and its resources to the test device(s) under test between the two test sockets on that interface board, for switching of test between those test sockets, according to certain embodiments of the invention.
Figure 4:
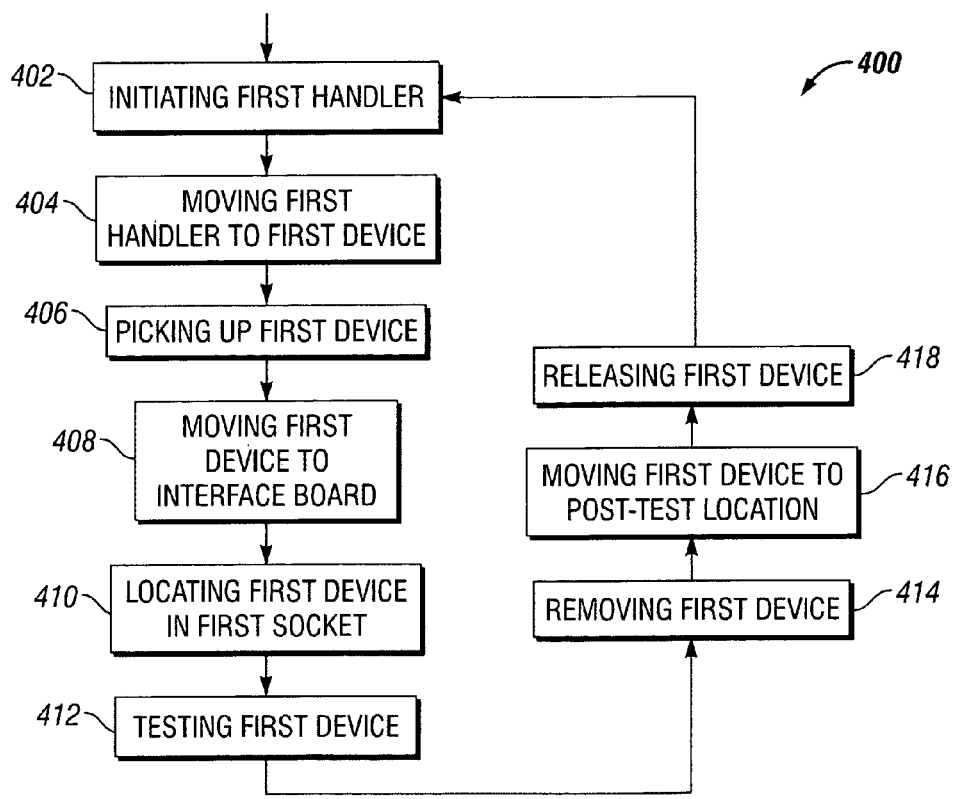
FIG. 4 illustrates a prior method for testing including index time required for a manipulator arm to move and replace each next successive test device for testing, such that testing of successive devices is interrupted and idle during periods of operation of the manipulator arm in moving and replacing each successive test device.

Referring to FIG. 3, a system 300 for testing a device 302 includes a tester 304, a robotic handler 308 having a first manipulator 312 and a second manipulator 314, an interface board 306 having a first socket 310 and a second socket 311, and a relay 316. The handler 308 is communicatively connected to the tester 304 and also communicatively connected to the relay 316 via the interface board 306. The interface board 306 is communicatively connected to the tester 304, the handler 308, the relay 316, and the sockets 310 and 311. The first socket 310 and the second socket 311 are communicatively connected to the tester 304 in parallel via the relay 316, such that the tester 304 is selectively switched in communicative connection, between testing at the socket 310 or the socket 311.

The relay 316 includes switch elements (not shown in detail) to switch testing connectivity between, respectively, the first socket 310 and the second socket 311. The relay 316 is not needed in low frequency testing (as shown in FIG. 2) because splitting of signals from the tester 304 to the first and second sockets 310, 311 will not result in asymmetries that cause significant timing and impedance problems. A rule of trace length matching in the design of the interface board 306 and interface board 206 (as shown in FIG. 2) should always be practiced since most semiconductor test systems use TDR (Time Domain Reflectometry) to calibrate out propagation delay among all signal connections between the tester and all interface pins on a device under test. Unequal trace length matching for a split signal, even when switched by relays as in system 300, will confuse a TDR system and result in erroneous calibration data and invalid test results. Additionally and to the extent possible, the transmission line impedance profile required by a given TDR system should be observed in the design of any test cell interface hardware.

Where higher frequency testing is conducted, however, splitting of signals from the tester 304 to the sockets 310, 311 can result in asymmetries such that timing and impedance problems can be significant. In such situations of higher frequency testing, therefore, the system 300 (of FIG. 3) switches the test signals between test socket 310, on the one hand, and the test socket 311, on the other hand, as applicable, to prevent impedance asymmetries of the test signals in respective testing at the sockets 310 and 311 at different time intervals. Observing a rule of trace length matching in the design of the interface board 306 allows TDR to be executed on system 300 as normal and without error.

In the system 300, the handler 308 and the tester 304 communicate substantially as described in reference to FIG. 1 and system 100 with regards to the handler 108 and the tester 104, in that the handler 308 issues a start-of-test signal to commence testing by the tester 304 and then the tester 304 returns to the handler 308 various results data and an end-of-test signal on test completion so that the handler 308 then commences next test device mechanical placement operations—i.e., the manipulator locating a next device for testing.

Further in the system 300, the communicative connection between the handler 308 and the relay 316, via the interface board 306, provides the handler 308 with conventional signals and communications with the tester 302 for appropriate handler 308 operations. The handler 308, itself, detects (or "knows") which of either socket 310 or socket 311 has therein located a next device waiting for test. The handler 308, therefore, can control the relay 316 switching to switch the tester 302 and tester resources between the first socket 310 or the second socket 311, according to the socket 310 or 311 holding the next device for test. An algorithm for relay 316 control is integrated into the same program of the handler 308 that controls the manipulators 312,314. Particularly, once an end-of-test signal issues from the tester 304 to the handler 308, the handler 308 sends a control signal to the relay 316 and switches it according to the next ready test device in the socket 310 or 311 as detected by the handler 308. The tester 304 operations effectively need not be altered, because the tester 304 merely continues testing of the next device and treats each socket 310,314 individually as a single socket connected to the same set of tester resources for purposes of tester 304 operations.

The tester does not detect and has no indicator (i.e., is not "aware") that there are two different physical socket locations (sockets 310 and socket 311). The tester 308, therefore, does not and need not have the information required to control the switching of the relay 316. Because the handler 308 has information applicable to control of the switching of the relay 316, the handler 308 can serve to switch the relay 316.

Alternatively, though, if the tester 304 must control the relay 316 (as may be applicable in certain applications or in alternative embodiments herein), a test program executing on the tester 308 must query the handler 308, receive the switching data, process the data into information in order to make a decision about switching and test device location among the sockets, and then send a control signal to the relay. This alternative requires code modification, recompilation, code testing, correlation, and release. It is expected that such variation of tester 308 control of switching would additionally add cost to the handler 308 design, since the handler 308 would be required to have an updated command set in the handler 308 system software. This work is both expensive and time consuming, but can be implemented with cost as an alternative arrangement for control of switching of the relay 316 and successive respective testing of devices in multiple sockets.

In operation of the system 300, the first socket 310 communicatively connects to the tester 304 through the relay 316, for testing of a device placed in the first socket 310. Then, the relay 316 causes the first socket 310 to be communicatively disconnected from the tester 304, and the second socket 311 communicatively connects to the tester 304 through the relay 316. In this manner, a device in the first socket 310 is tested by the tester 308, immediately followed by testing of another device in the second socket 311. The first manipulator 312 manipulates the device for the first socket 310 into and out of the first socket 310 during times of testing the other device in the second socket 311, and vice versa. The system 300, thus, eliminates idle time of the tester 308 which is otherwise experienced when the first manipulator 312 and the second manipulator 314 are respectively mechanically operating to pick-up, position on the socket, and remove devices in testing operations.

Figure 5:
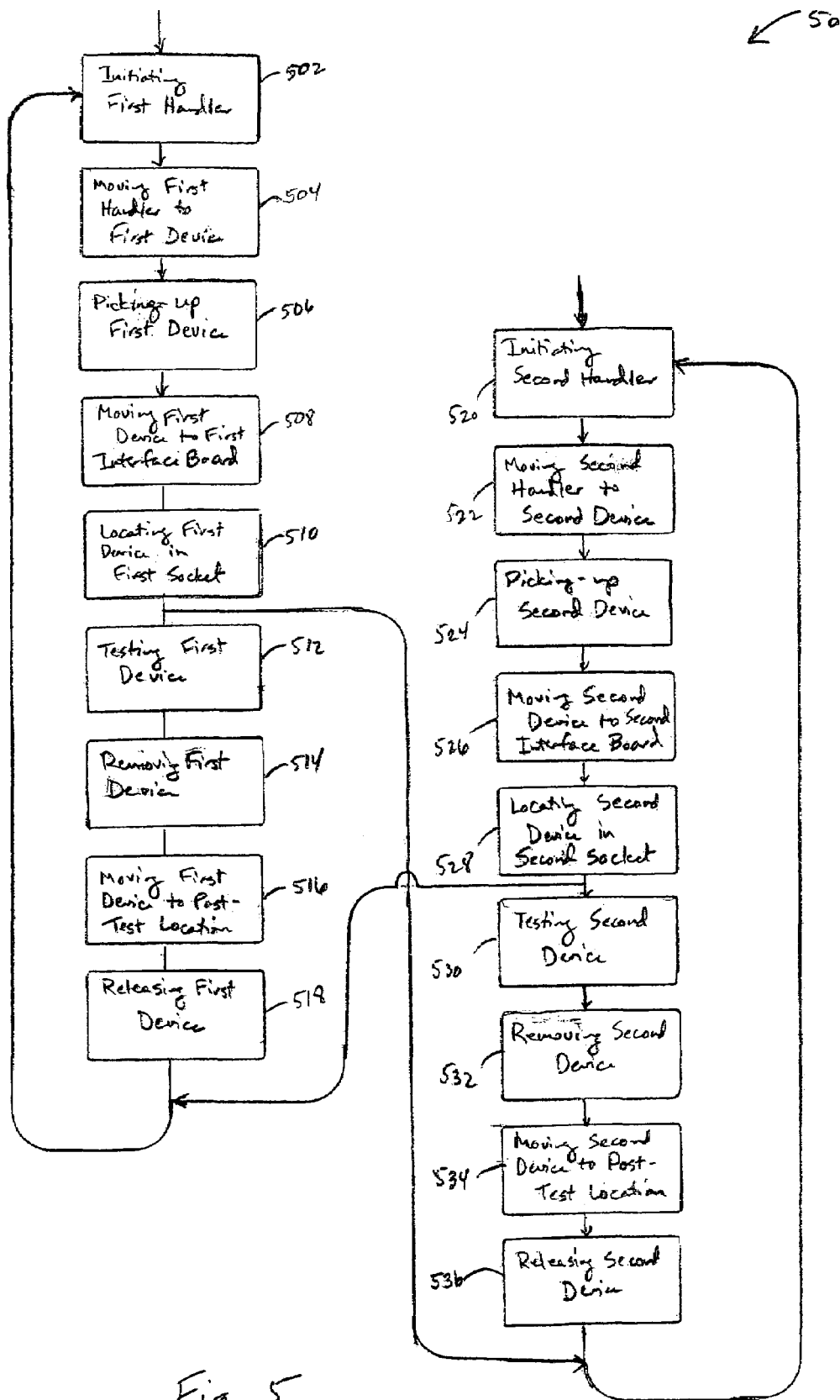
FIG. 5 illustrates a method for testing including negligible index time required, wherein a pair of test sockets and two manipulator arms effect immediate successive testing of devices at each of the test sockets on the interface board, the sockets are wired in parallel to the same set of tester resources on the interface board that interconnects the same set of tester resources to the devices under test, and the negligible index time is achieved by moving and replacing a device in one test socket while testing is being performed in the other test socket, and vice versa, according to certain embodiments of the invention.

Referring to FIG. 5, a method 500 operates in the system 200 of FIG. 2 or the system 300 of FIG. 3. In the method 500, a first manipulator is initiated in a step 502 to commence retrieval of a first test device for testing in a first socket of an interface board connected to a tester. The tester in the method 500 is also connected to a second socket, but in parallel communicative connectivity with the first socket. The method 500 can include relay of signals of the tester, such as occurs in the system 300 of FIG. 3 in a high frequency testing environment; or, alternatively, the signals of the tester can be split so that there is no relay of test socket testing signals. The same method 500 applies to operations of the manipulators for testing, notwithstanding whether or not any relay is present.

In a step 504, the first manipulator then moves to the first device for testing. The first manipulator picks-up the first device in the step 506. The first manipulator moves the first device to the first interface board in a step 508, and inserts the first device into the first socket of the first interface board in a step 510.

Thereafter, the tester commences testing the first device via the first socket, in a step 512.

Once the first device is located in the first interface board in the step 510 and as the step 512 of testing the first device commences, the second manipulator is initiated in a step 520. In a step 522, the second manipulator moves to a second device. The second manipulator picks-up the second device in a step 524, and moves the second device to the second interface board in a step 526. In a step 528, the second manipulator inserts the second device into the second socket of the interface board (either at the same time testing of the first device is occurring in the configuration of the system with the relay; or otherwise, immediately upon removal of the first device from the first socket after testing of the first device and insertion into the second socket of the second device is completed if there is not any relay).

Upon completion of testing the first device, the first manipulator in a step 514 removes the first device from the first socket in the first interface board. Promptly upon completion of testing the first device, the tester commences testing of the second device in a step 530. If the testing environment involves high frequency signals of the tester, the relay (of FIG. 3) switches the test signals of the tester from the first socket to the second socket, in order to begin the test of the second device. As previously mentioned, in low frequency testing, the relay is not necessary and test signals of the tester can be split between the first socket and device therein, and the second socket and device therein, without asymmetry concerns of timing and impedance problems. In either event, the testing of the first device concludes and the testing of the second device immediately commences. Thus, there is virtually no idle time of the tester and the index time in the method 500 is minimal.

During testing of the second device in the step 530, the first manipulator removes the first device from the first socket in the step 514. The first manipulator thereafter moves the first device in a step 516, such as to a post-test location for the devices being tested. In a step 518, the first manipulator releases the first device. Responsive to a signal indication from the handler that a next device is waiting to be picked-up by the first manipulator for testing in the step 512, the first manipulator is again initiated in the step 502. The method 500 then continues with respect to the first manipulator again through the steps of the method 500.

When testing of the second device is completed in the step 530, the method 500 as to the first manipulator has located a next successive test device in the first socket pursuant to the step 510 (either upon test completion and removal of the second device from the second socket and insertion of the next successive device in the first socket if no relay in the system; or otherwise, upon switching of tester resources to the first socket upon completion of the testing of the second socket where the system includes the relay). Thus, immediate testing of this next successive device commences via the step 512.

During the testing of the next successive device, the method 500 continues with respect to the second manipulator in the step 532 of removing the second device from the second interface board. Next, in a step 534, the second manipulator moves the second device to a post-test location. In a step 536, the second device is released by the second manipulator at the location.

The method 500 continues with respect to the second manipulator, during the testing at the first socket in the step 512, by again initiating the second manipulator in the step 520. As testing at the first interface board proceeds in the step 512, the second manipulator proceeds through steps 522, 524, 526 and 528 of the method 500. Once testing at the first interface board is completed, the second manipulator has, via the method 500, located a next successive test device in the second interface board and testing of the device proceeds in the step 530.

Of course, during the testing of the second device, the method 500 continues with respect to the first manipulator through the steps 514, 516, 518 and back to 502 of the method 500. In this manner, the tester is virtually continuously performing successive testing of respective devices in the successive steps 512, 530. While testing is proceeding in step 512, the second manipulator moves through the steps 532, 534, 536, and again to 520 and on, of the method 500. Likewise, while testing next proceeds in step 530, the first manipulator moves through the steps 514, 516, 518, and back to steps 502, 504, 506, 508 and 510 of the method 500. The method 500 proceeds continuously in this manner, until interrupted (for example, manually by a test supervisor, automatically because of default, or otherwise), or otherwise until all devices for testing are tested and handled in the method 500.

With the foregoing systems 200, 300 (of FIGS. 2 and 3) and method 500 (of FIG. 5), various alternatives and additions are possible. Particularly, certain conventional interface boards may have several test sockets or cells for simultaneous testing of multiple devices via a tester. In such instances, the robotic handler can have manipulators that simultaneously manipulate, move and place multiple testing devices in the interface board in a single pass. The systems 200, 300 will similarly include dual interface boards in parallel connection with the tester (or, if applicable, sets of parallel-connected sockets and/or interface boards), however, each interface board will have several sockets for simultaneous placement and testing of devices on each respective board. The method 500 will, nonetheless, proceed similarly, with the exception that multiple devices will simultaneously be handled by the respective manipulators.

In other alternatives, multiple manipulators beyond two, and multiple interface boards beyond two, can be employed. In such instances, each interface board can, likewise, have multiple testing sockets for simultaneous testing at each board of multiple devices. The interface boards can be communicatively connected in parallel to the tester, and any necessary relay can serve to switch test signals as required.

Moreover, testing systems in accordance with the systems 200, 300, and test steps and processes in accordance with the method 500, can be employed in a wide variety of manufacturing and testing operations. For example, semiconductor devices are only one type of devices suitably tested with the systems and methods. Other devices can include optical devices, with appropriate optical testing boards, relay, and tester; mechanical devices, with appropriate mechanical and physical test cells and tester; and any of a wide variety of other possibilities. In each such possibility, parallel connected interfaces to the tester, coupled with multi-manipulator operations, can reduce and eliminate index times in the test process.

In view of the foregoing, and without limiting the scope of the description herein, a detail of an example semiconductor test arrangement is given.

Figure 6:
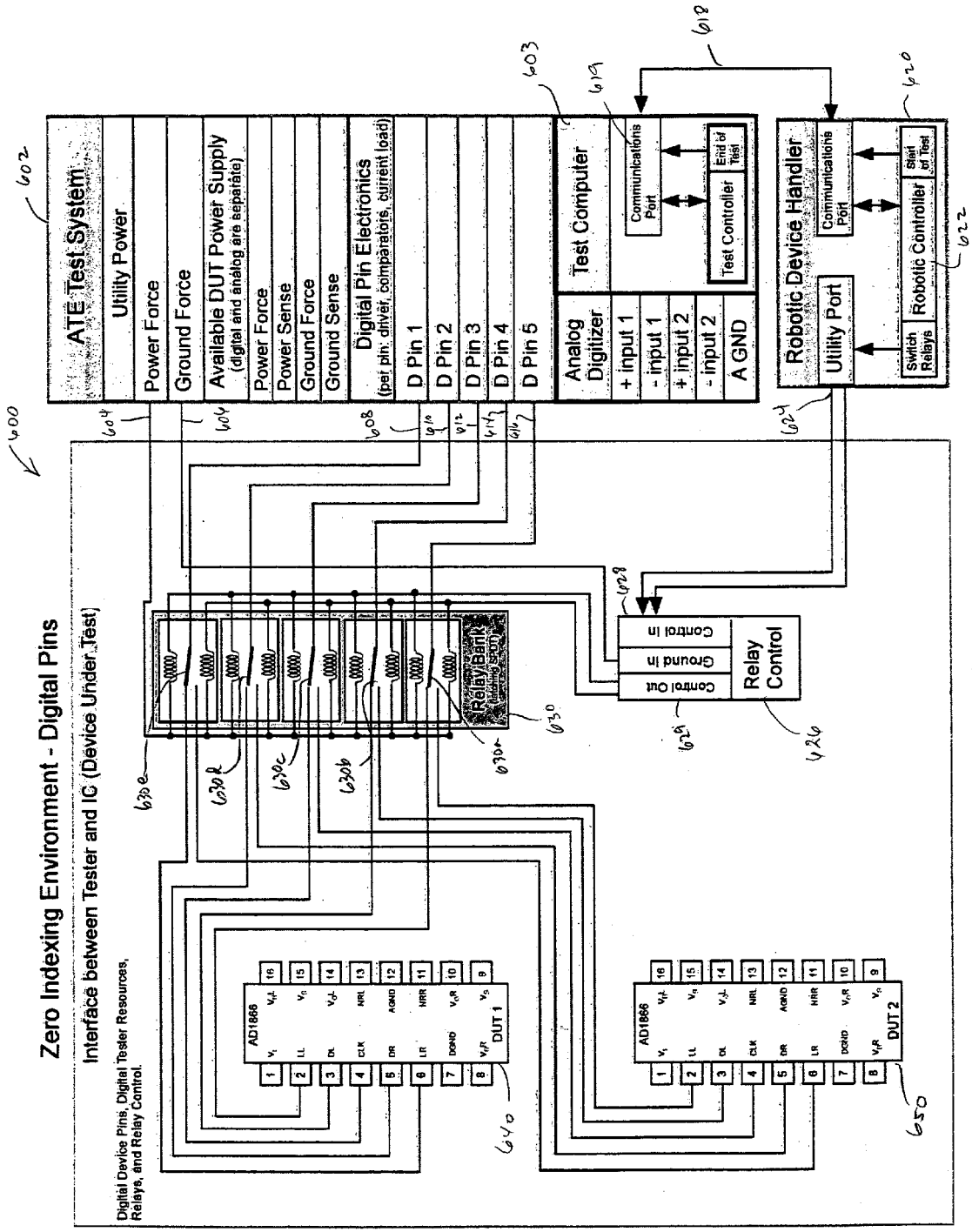
FIG. 6 illustrates a system for testing digital pins of devices according to the method of FIG. 5, wherein index time is negligible, including a switch on the interface board that selects between each of a pair of test sockets wired in parallel to the same set of tester resources, and two manipulator arms for manipulating devices for testing in one test socket while testing is performed in the other test socket, and vice versa, according to certain embodiments of the invention.

1. Semiconductor Automated Test Equipment (ATE)—Example Embodiment:

Referring to FIG. 6, a digital device testing system 600 can be used for testing a semiconductor chip or the like. The system 600 includes a conventional automated test equipment (ATE) 602. The ATE 602 is driven by a power supply (not shown) and includes a test computer 603 for controlling and performing applicable tests via the ATE 602. The ATE 602 has connector ports for power 604, ground 606, and digital pin electronics 608, 610, 612, 614, 616. The ATE 602 is communicatively connected, via a connector 618 at a communications port 619 of the ATE 602, to a robotic device manipulator 630 having dual manipulator arms. The robotic device handler 620 includes a robotic controller 622 for receiving and processing signals and test information from the ATE 602, via the connector 618.

A utility port 624 of the device handler 620 connects to a relay control 626 at a control port 628 thereof. The relay control 626 also connects to the ground 606 port of the ATE 602. Output control signals are connected to a relay bank 630, from a port 629 of the relay control 626.

The relay bank 630 includes a series of relay switches 630a through 630e, for example. Details of the relay bank 630 and relay control 626 are more particularly later described in connection with FIG. 7 herein. For purposes of discussion in connection with FIG. 6, each relay switch 630a though 630e is connected to respective and corresponding digital pins of a first device under test (DUT1) 640 and a second device under test (DUT2) 650. In FIG. 6, the switches 630a through 630e are set to communicate test signals to the DUT1 640. As previously described with respect to the method 500 in FIG. 5, both the DUT1 640 and the DUT2 650 are connected via respective interface boards (not shown in FIG. 6) to the relay bank 630. In this manner, after testing of the DUT1 640 is completed, the relay control 626 effects switching of the switches 630a through 630e of the relay bank 630, in order to next test the DUT2 650.

The relay control 626 selects switching of the switches 630a through 630e of the relay bank 630, based on control signal from the robotic device manipulator 624. The robotic device manipulator 624 communicates with (by exchange of signals back and forth) the test computer 603 of the ATE 602, for example, when testing of a device is completed. In the example, the robotic device manipulator 624 initiates the test process of the ATE 602 upon completing placement of the DUT1 640 in the interface board connected through the relay bank 630 to the ATE 602. The ATE 602 then conducts testing, according to the testing protocols programmed and controlled by the test computer 603 of the ATE 602.

Upon completion of the testing of the DUT1 640 by the ATE 602, the ATE 602 signals the robotic device handler 620 of the test completion, for example, by communicating test results for the DUT1 640 to the handler 620. The handler 620 then controls the manipulator arms as appropriate to remove the DUT1 640 from its socket on the interface board connected through to the ATE 602. Upon receiving the end of test signal from the ATE 602, the handler 620 signals to the relay control 626 and the relay control 626 flips the switches 630a through 630e of the relay bank 630 to communicatively connect the DUT2 650 through the relay bank 630 to the ATE 602. The handler 620 then issues the next start-of-test signal to the ATE 602, and the ATE 602 then commences testing of the DUT2 650.

As described in connection with the method 500 in FIG. 5, the robotic device handler 620 manipulates one of its manipulator arms to remove and move the already tested device and to retrieve and place a new device for testing, each time a device is tested. This operation of the device handler 620, coordinated with the relay bank 630 and ATE 602, ensures that the ATE 602 is substantially continuously testing a device while the other device is being removed and replaced.

Figure 7:
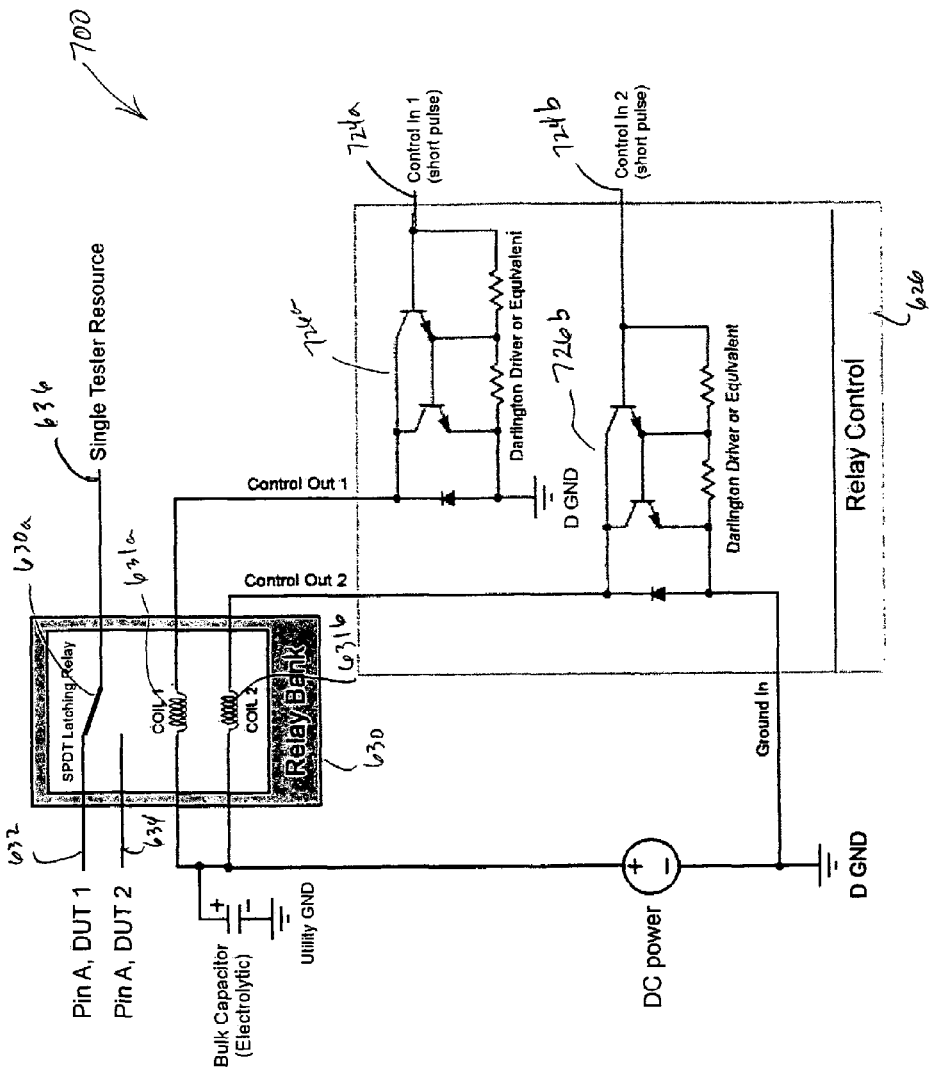
FIG. 7 illustrates an electrical circuit and hardware components for use in the system of FIG. 6, for controlling the switching of electrical connections between each test socket of a pair of test sockets on an interface board, wherein the switch selects between one of the pair of test sockets wired in parallel to the same set of tester resources and constrains the operation so that only one socket of the pair is connected to the tester at any given instant in time, and the switch provides electrical isolation from the tester for one of the test sockets, while the other socket is electrically connected to the tester and available for use in testing, and vice versa, according to certain embodiments of the invention.

Referring to FIG. 7, a relay 700, like that described in connection with FIG. 6, includes a relay control 626 and a relay bank 630. For purposes of the illustration in FIG. 7 and description of the relay 700, the relay control 626 and the relay bank 630 each provide for only a single switch 630a. The switch 630a operates between two possible connections, a connector 632 to PinA, DUT1, or a connector 634 to PinA, DUT2. The switch 630a effects communicative connection of either such connector 632, 634 to a single test signal 636 from the tester (not shown in FIG. 7). As is typical in the relay 700, relevant signals input as 724a, 724b from the robotic device manipulator (not shown in FIG. 7) cause the switch 630a to connect through the signal 636 through the switch 630a to either the connector 632 or 634, as desired for testing of the respective DUT1 or DUT2.

The relay control 626 has inputs of a first control signal 724a and a second control signal 724b, from the utility port 624 (not shown in FIG. 7) of the robotic device handler 620 of FIG. 6. Each control signal 724a, 724b connects to respective "Darlington Drivers" or equivalent power transistor drivers 726a, 726b. These drivers 726a, 726b are available, for example, from NTE Electronics, Inc. part number NTE215 Silicon NPN Transistor Darlington Driver. The respective drivers 726a, 726b connect to ground and also to a relay bank 730.

The relay bank 730 shown in FIG. 7 is substantially simplified from that used in the system 600 of FIG. 6, wherein multiple pins of each device under test (i.e., DUT1 and DUT2) are concurrently connected to the tester 602 through the relay bank 630. Nonetheless, the relay bank 630 of FIG. 7 illustrates a single switch 630a of the corresponding relay bank 630 in FIG. 6. The switch 630a is disposed at the relay bank 630 between coils 631a, 631b. The coils 631a, 631b are respectively driven by the outputs of the respective transistor drivers 726a, 726b of the relay control 626. The relay control 626, in this manner, switches the switch 630a in order to selectively communicatively connect either Pin A, DUT1 632 or Pin A, DUT2 634 for testing via the test signal 636 at each test instance.

In general in the embodiments, complete testing protocols will be performed on a first test device, then the relay control 626 will cause switching to a second device for testing, and thereafter repeated. During testing of any device, the next device for testing is being retrieved and located in the interface board for next testing. Then, upon completion of a test on a device, the relay control 626 switches the relay bank 630 to the next successive device for testing, and testing of each next successive device immediately commences and continues in this manner without any significant index time delays.

Figure 8:
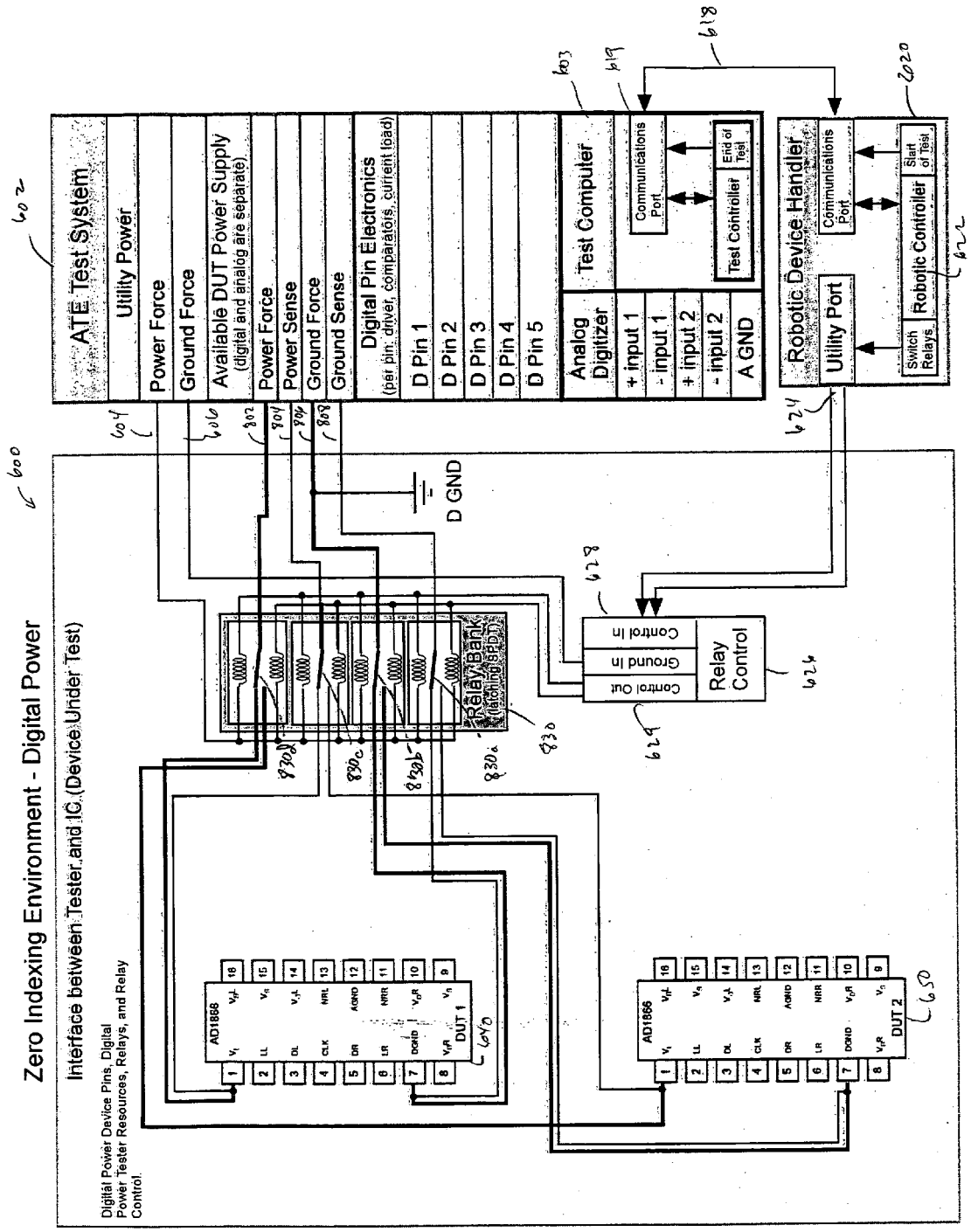
FIG. 8 illustrates a system, substantially like that of FIG. 6, for testing digital power of test devices according to the method of FIG. 5, according to certain embodiments of the invention.

Referring to FIG. 8, the system 600 of FIG. 6 is illustrated showing connections for digital power of devices in testing. Particularly, the system 600 includes the ATE 602, the robotic device handler 620, the relay control 626, and a relay bank 830 connected across switches 830a through 830d between power connectors 802, 804 and ground connectors 806, 808 and respective digital power pins of each of the DUT1 640 and the DUT2 650. As with the system 600 of FIG. 6, the system 600 in FIG. 7 serves to provide substantially continuous sequential power testing of the DUT1 640, followed by the DUT2 650, with robotic manipulator handling and replacement of each respective DUT while the other DUT is communicatively connected by the switches 830a through 830d of the relay bank 830 to the tester 602 for testing.

Figure 9:
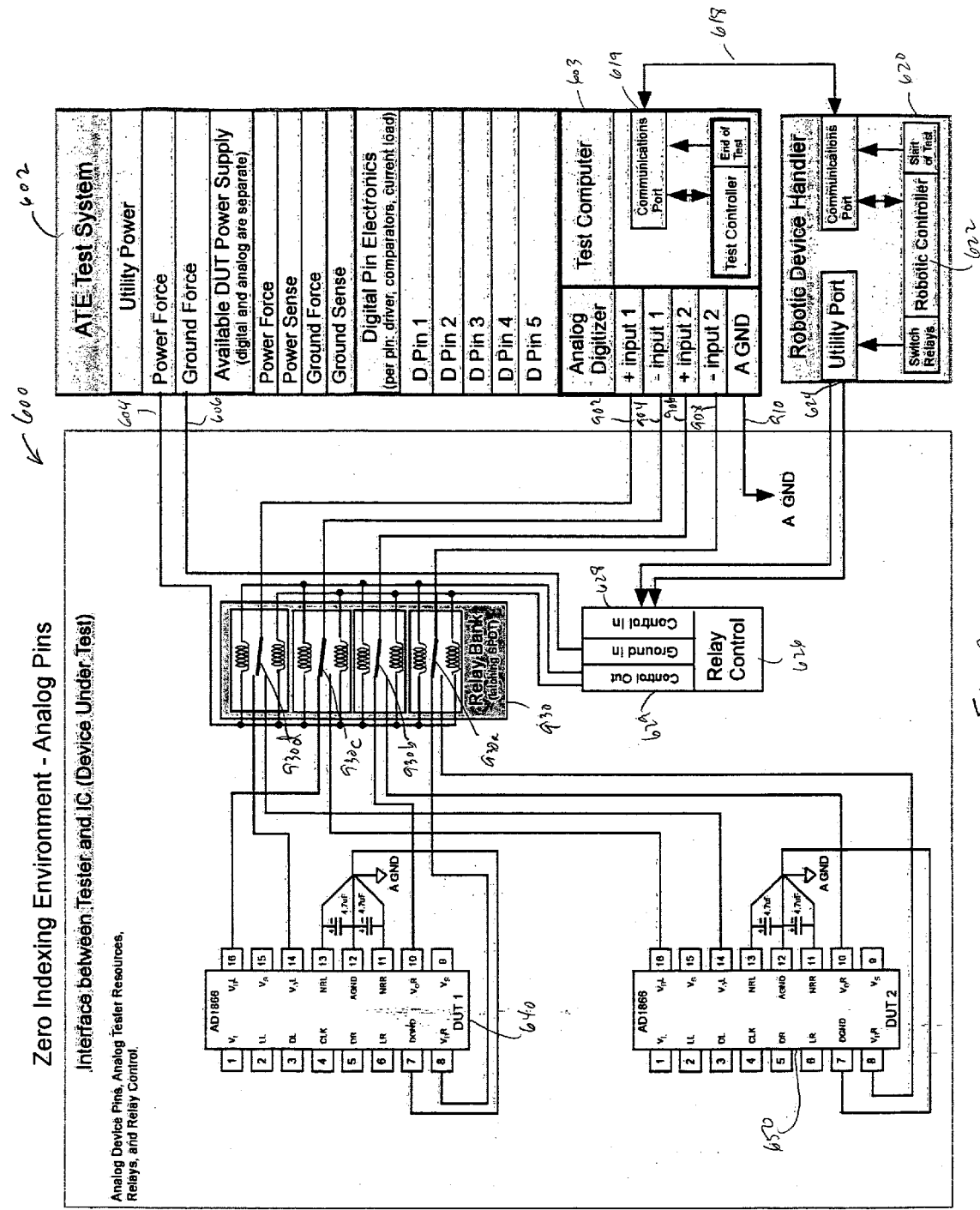
FIG. 9 illustrates a system, substantially like that of FIGS. 6 and 8, for testing analog pins of test devices according to the method of FIG. 5, according to certain embodiments of the invention.

Referring to FIG. 9, the system 600 of FIGS. 6 and 8 is illustrated showing connections for analog pin testing of respective devices, DUT1 640 and DUT2 650. In the system 600 of FIG. 9, the ATE 602 connects at analog digitizer connections 902, 904, 906, 908 to the respective switches 930d, 930c, 930b, 930a of the relay bank 930. Each of the switches 930a, 930b, 930c, 930d connects to the respective DUT1 640 and DUT2 650 at analog pins thereof. As with the system 600 of the prior illustrations, the switches 930a, 930b, 930c, 930d are controlled by the relay control 626, via the manipulator 630, in order to respectively communicatively connect the tester 602 for testing of each respective DUT1 640 and DUT2 650, in virtually uninterrupted succession. While one of the DUT's is being tested, the other DUT is being moved and replaced by the handler 620 with a next device for testing.

Figure 10:
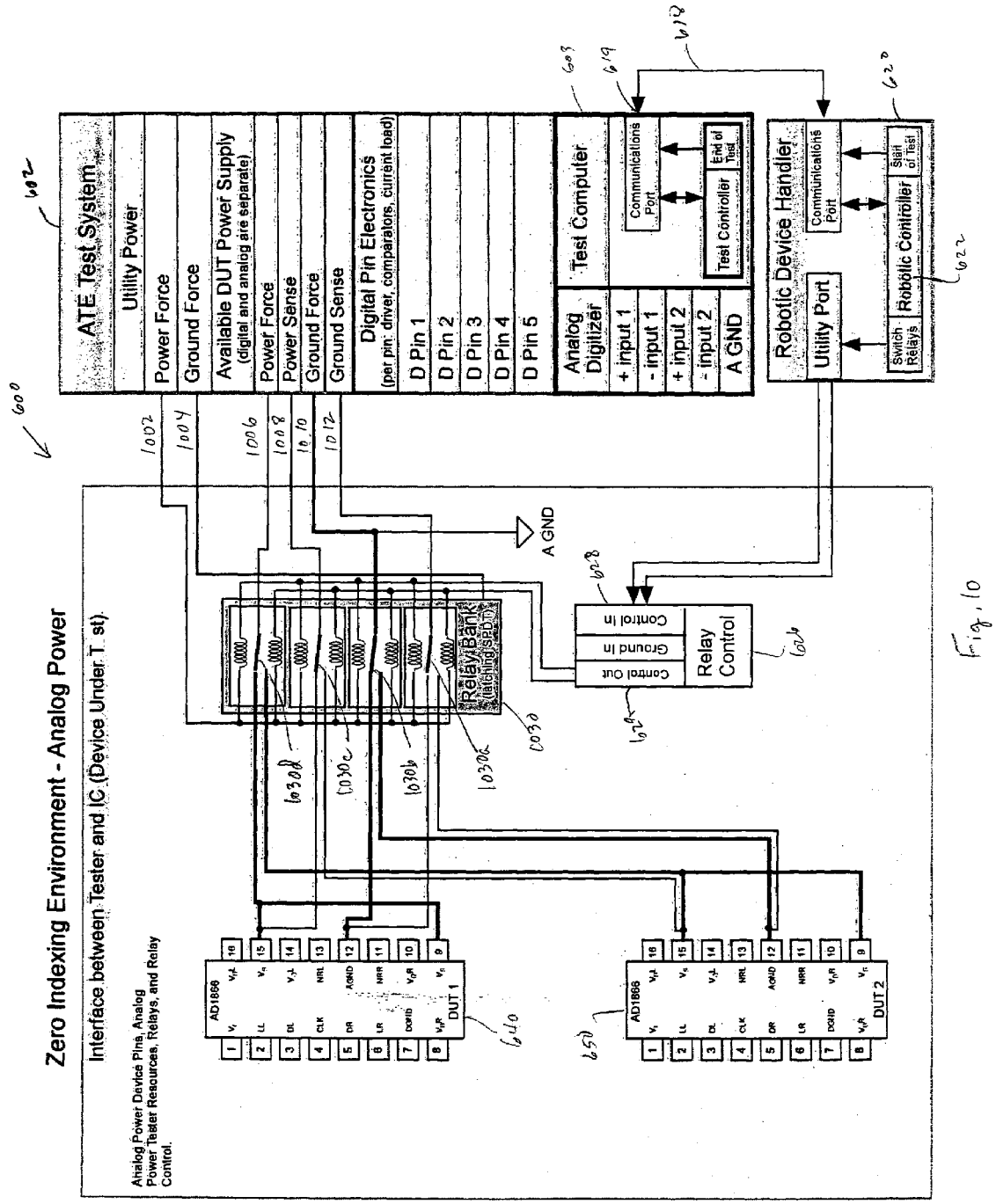
FIG. 10 illustrates a system, substantially like that of FIGS. 6, 8 and 9, for testing analog power of test devices according to the method of FIG. 5, according to certain embodiments of the invention.

Referring to FIG. 10, the system 600 of FIGS. 6, 8 and 9 is illustrated showing connections for analog power testing of respective devices, DUT1 640 and DUT2 650. In the system 600 of FIG. 10, the ATE 602 connects at utility power connections 1002, 1004 across the coils of the relay bank 1030 with the relay control 626. The switches 1030d, 1030c, 1030b, 1030a are connected to DUT power connections 1006, 1008, 1010, 1012 of the tester 602. Similarly to the prior discussion, the respective switches 1030d, 1030c, 1030b, 1030a of the relay bank 1030 each selectively communicatively connect the tester 602 to each of the respective DUT1 640 and DUT2 650 at analog power pins thereof. The switches 1030*a*, 1030*b*, 1030*c*, 1030*d* are controlled by the relay control 626, via the manipulator 630, in order to respectively communicatively connect the tester 602 for testing of each respective DUT1 640 and DUT2 650, in virtually uninterrupted succession. While one of the DUT's is being tested, the other DUT is being moved and replaced by the handler 620 with a next device for testing.

Referring to FIGS. 6 through 10, in conjunction, it is illustrated and can be understood that multiple ones of the relay banks 630, 830, 930, 1030 can be employed at the same time in the system 600, in order to perform testing of respective ones of the DUT1 640 and DUT2 650 in immediate succession. During testing of one of the DUT's, the handler 620 moves and replaces the other DUT. In such arrangement, the relay control 626 controls switching of each of the relay banks 630, 830, 930, 1030 in order that each DUT may be successively tested as the DUT1 640 and DUT2 650. Because the handler 620 changes a DUT with a new device for testing, during the testing of the other DUT, the index time for the system 600 is negligible and testing of successive devices is substantially continuous by the tester 602.

Figure 11:
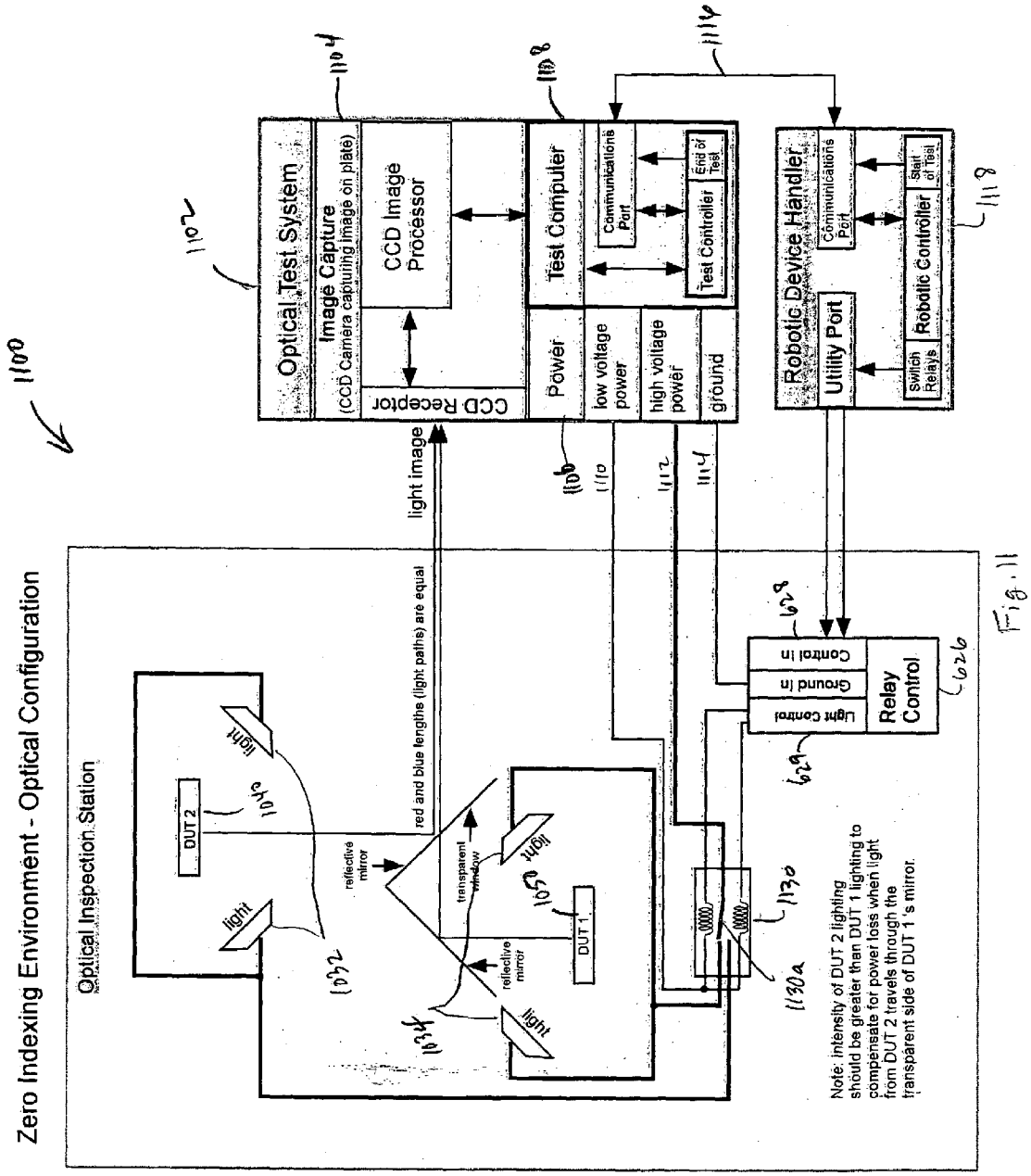
FIG. 11 illustrates a system for testing optical devices, substantially in accordance with the concepts of FIGS. 5, 6, 8, 9 and 10, according to certain embodiments of the invention.

2. Optical Device Automated Test Equipment (ATE)—Example Embodiment:

Referring to FIG. 11, another test system 1100 for testing optical devices employs similar relay elements in order to perform continuous successive testing by a tester 1102. The tester 1102 includes an image capturer 1104, having a CCD receptor and a CCD image processor. The image capturer 1104 is connected to a test computer 1108 of the tester 1102. The tester 1102 also includes a power source 1106 and connections 1110, 1112, 1114 therefrom.

The test computer 1108 of the tester 1102 communicatively connects, via a connector 1116, to a robotic manipulator 1118. The robotic manipulator 1118 is substantially as has been previously described, including the manipulator 1118 has dual manipulator arms and receives test information and controls testing of respective dual devices, a DUT1 1050 and DUT2 1040, via connections to a relay control 626, as previously detailed. The relay control 626 controls switching of a switch 1130*a* of a relay 1130. The switching effects communicative connections, across the relay 1130, between the tester 1102 and respective test capture elements 1032, 1034 for the corresponding DUT1 1032 and DUT2 1034, respectively. As with the prior descriptions of the system 600 (of FIGS. 6, 8, 9 and 10), the system 1100 switches testing between the DUT1 1040 and the DUT2 1050, in immediate succession. During testing of one of the DUT's, the other DUT is moved and replaced by the manipulator 1118 with a next device for testing. In this manner, the tester 1102 substantially continues testing operations with each successive next device, with negligible idle index time.

Referring to FIG. 12, a timing diagram 1200 illustrates testing cycles for respective first and second devices (i.e., DUT1 and DUT2) in a test system of the type described herein. It is notable in the timing diagram 1200 that index times are negligible, because the manipulator, via dual manipulator arms, can manipulate one device while the other device is being tested, and vice versa. Thus, at each instant, a device for testing is located in a socket for testing, and the system switches the test between devices in order to at each such instant continue testing for the device so readied for testing. Once testing of a device is completed, the other device can be immediately tested, upon switching of the test to the next device.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems and any element(s) that may cause any benefit, advantage, or solution to occur or become more pronounced are not to be construed as a critical, required, or essential feature or element of any or all the claims. As used herein, the terms "comprises, "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A system for testing, comprising:
   a tester, having a tester resource;
   an interface board connected to the tester;
   a first socket of the interface board connectable to the tester;
   a second socket of the interface board connectable to the tester;
   a first manipulator arm connected to the tester;
   a second manipulator arm connected to the tester;
   a switch connected to the tester and the interface board, wherein the switch selectively effects communicative connection of the tester resource of the tester to one of either the first socket and the second socket, respectively, at each instant of testing via the tester;
   a controller connected to the first manipulator arm and the second manipulator arm, and also connected to the tester, wherein the controller is a master and the tester is a slave in control of testing, via the tester resource, at one of either the first socket and the second socket, respectively at each instant.

2. The system of claim 1,
   wherein the controller operates the switch to selectively effect communication of the test resource of the tester to one of either of the first socket and the second socket, respectively, at each instant of testing via the tester.

3. The system of claim 2, wherein the communicative connection by the switch, of the tester resource to each of the first socket and the second socket, respectively, is trace length matched.

* * * * *

UNITED STATES PATENT AND TRADEMARK OFFICE
CERTIFICATE OF CORRECTION

PATENT NO. : 7,183,785 B2
APPLICATION NO. : 10/767932
DATED : February 27, 2009
INVENTOR(S) : Howard Roberts It is certified that error appears in the above-identified patent and that said Letters Patent is hereby corrected as shown below:

Title page, item [76] inventor should read --Howard Roberts, 4519 Ave. D., Austin, TX (US) 78751.--

Signed and Sealed this

Twenty-third Day of February, 2010

David J. Kappos
*Director of the United States Patent and Trademark Office*